(12) United States Patent
Wang et al.

(10) Patent No.: US 9,201,102 B2
(45) Date of Patent: Dec. 1, 2015

(54) AC SIGNAL DETECTOR AND THE METHOD THEREOF

(71) Applicant: Chengdu Monolithic Power Systems Co., Ltd., Chengdu (CN)

(72) Inventors: Siran Wang, Hangzhou (CN); Yike Li, Chengdu (CN); Kun Yi, Chengdu (CN); Yuancheng Ren, Hangzhou (CN); Junming Zhang, Hangzhou (CN); En Li, Hangzhou (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 209 days.

(21) Appl. No.: 13/931,749

(22) Filed: Jun. 28, 2013

(65) Prior Publication Data

US 2014/0153301 A1 Jun. 5, 2014

(30) Foreign Application Priority Data

Jul. 16, 2012 (CN) .......................... 2012 1 0245442

(51) Int. Cl.
| | |
|---|---|
| G01R 19/15 | (2006.01) |
| H02H 7/125 | (2006.01) |
| G01R 19/175 | (2006.01) |
| G01R 31/42 | (2006.01) |

(52) U.S. Cl.
CPC .............. *G01R 19/175* (2013.01); *G01R 31/42* (2013.01)

(58) Field of Classification Search
CPC ................................ G01R 19/15; H02H 7/125
See application file for complete search history.

(56) References Cited

U.S. PATENT DOCUMENTS

| | | | | |
|---|---|---|---|---|
| 2010/0204860 | A1* | 8/2010 | Mitsutani | 701/22 |
| 2012/0007567 | A1 | 1/2012 | Disney et al. | |
| 2013/0044403 | A1 | 2/2013 | Urienza | |
| 2013/0322122 | A1* | 12/2013 | Sigamani et al. | 363/13 |
| 2014/0036561 | A1* | 2/2014 | Sakurai et al. | 363/126 |

\* cited by examiner

*Primary Examiner* — Emily P Pham
(74) *Attorney, Agent, or Firm* — Perkins Coie LLP (57) ABSTRACT

An AC signal detector having: a rectify circuit having a first input terminal and a second input terminal configured to receive an AC signal, and an output terminal configured to provide a rectified signal based on the AC signal; a detecting circuit having an input terminal coupled to the output terminal of the rectify circuit to receive the rectified signal, and an output terminal configured to provide a square signal based on the rectified signal; and an unplug indicate circuit having an input terminal coupled to the detecting circuit to receive the square signal, and an output terminal configured to provide an unplug indicate signal based on the square signal.

20 Claims, 9 Drawing Sheets

AC SIGNAL DETECTOR AND THE METHOD THEREOF

CROSS-REFERENCE TO RELATED APPLICATION(S)

This application claims priority to and the benefit of Chinese Patent Application No. 201210245442.3, filed Jul. 16, 2012, which is incorporated herein by reference in its entirety.

TECHNICAL FIELD

The present invention relates generally to electronic circuits, and more particularly but not exclusively to AC circuits and the method thereof.

BACKGROUND

Figure 1:
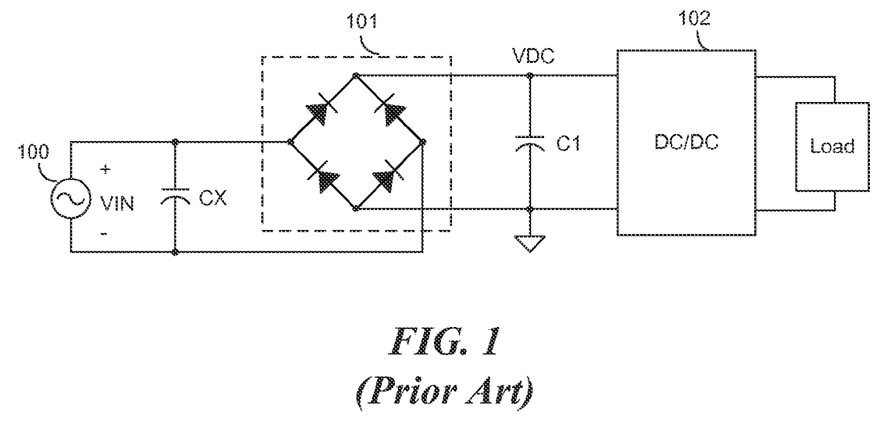
FIG. 1 schematically shows a prior art AC/DC converter.

Many electronic equipment are powered by DC power supplies normally converted from AC power supplies. FIG. 1 schematically shows a prior art AC/DC converter. As shown in FIG. 1, the AC/DC converter comprises a full-bridge rectifier 101 and a DC/DC converter 102. The full-bridge rectifier 101 is coupled to an AC power supply to convert an AC voltage VIN to a rectified voltage VDC. Then the DC/DC converter 102 converts the rectified voltage VDC to a DC voltage supplied to a load.

In FIG. 1, a X-cap (safety capacitor) CX is coupled between the AC power supply and the full-bridge rectifier 101 to reduce the EMI (Electro-Magnetic Interference) of the AC/DC converter. An input capacitor C1 is coupled in parallel with the full-bridge rectifier 101 to filter the rectified signal VDC and to store energy when necessary. In actual use, after the AC/DC converter is unplugged, an accident caused by the residual charge in the X-cap may happen. Thus, the X-cap CX should be discharged completely and in a timely manner when the AC/DC converter is unplugged. A detector detecting when the AC/DC converter is unplugged is needed to determine when the X-cap should be discharged.

SUMMARY

It is an object of the present invention to provide an AC signal detector and the method thereof to solve the above problems.

In accomplishing the above and other objects, there has been provided, in accordance with an embodiment of the present invention, an AC signal detector comprising: a rectify circuit having a first input terminal and a second input terminal configured to receive an AC signal, and an output terminal configured to provide a rectified signal based on the AC signal; a detecting circuit having an input terminal coupled to the output terminal of the rectify circuit to receive the rectified signal, and an output terminal configured to provide a square signal based on the rectified signal; and an unplug indicate circuit having an input terminal coupled to the detecting circuit to receive the square signal, and an output terminal configured to provide an unplug indicate signal based on the square signal.

Furthermore, there has been provided, in accordance with an embodiment of the present invention, an AC/DC converter, comprising: a X-cap having a first terminal and a second terminal, wherein the X-cap is coupled in parallel with an AC signal; a rectify circuit having a first input terminal and a second input terminal configured to receive the AC signal, and an output terminal configured to provide a rectified signal based on the AC signal; a detecting circuit having an input terminal coupled to the output terminal of the rectify circuit to receive the rectified signal, and an output terminal configured to provide a square signal based on the rectified signal; an unplug indicate circuit having an input terminal coupled to the detecting circuit to receive the square signal, and an output terminal configured to provide an unplug indicate signal based on the square signal; and a discharging circuit having a first terminal coupled to the first terminal of the X cap, a second terminal connected to the ground and a control terminal configured to receive the unplug indicate signal; wherein the discharging circuit discharges the X-cap when the unplug indicate signal is valid.

In addition, there has been provided, in accordance with an embodiment of the present invention, a method for detecting an AC signal, comprising: rectifying an AC signal to a rectified signal by a rectifier; generating a delayed rectified signal by delaying the rectified signal; generating a square signal based on the comparison of the rectified signal and the delayed rectified signal; detecting the square signal to generate a pulse at every switching cycle of the square signal; and generating an unplug indicate signal based on comparing the interval time between the adjacent pulses with a preset value; wherein the unplug indicate signal is valid to indicate that the AC signal is unplugged when the interval time between the adjacent pulses is larger than the preset value, and the unplug indicate signal is invalid to indicate that the AC signal is plugged properly when the interval time between the adjacent pulses is smaller than the preset value.

The presented AC signal detector and the method thereof detects when the AC/DC converter is unplugged to make sure that the X-cap be discharged completely and in a timely manner.

BRIEF DESCRIPTION OF THE DRAWINGS

The use of the same reference label in different drawings indicates same or like components.

DETAILED DESCRIPTION

In the present invention, numerous specific details are provided, such as examples of circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 2:
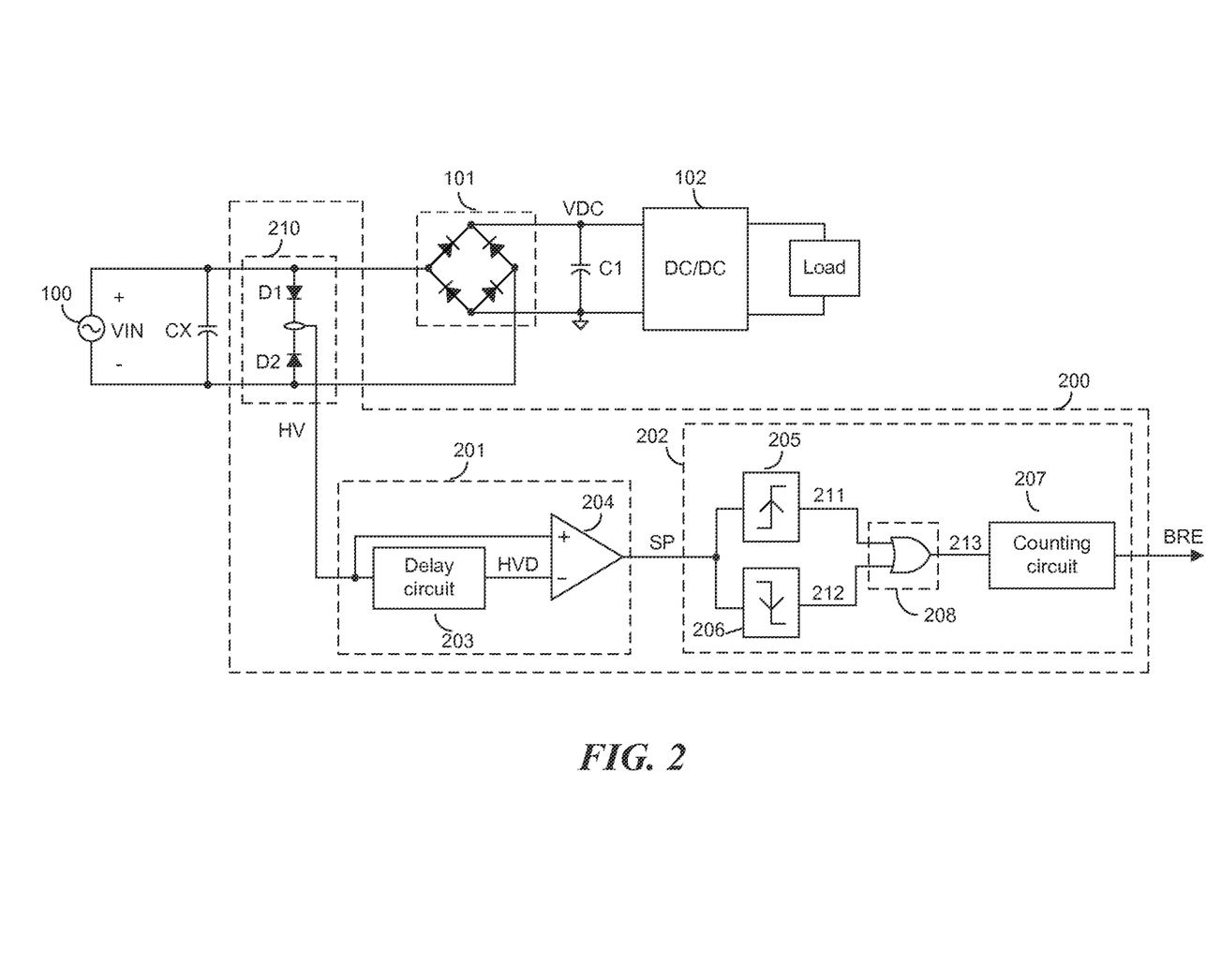
FIG. 2 schematically shows an AC signal detector 200 in accordance with an embodiment of the present invention.

FIG. 2 schematically shows an AC signal detector 200 in accordance with an embodiment of the present invention. The AC signal detector 200 comprises: a rectify circuit 210 having a first input terminal and a second input terminal configured to receive an AC signal VIN, and an output terminal configured to provide a rectified signal HV based on the AC signal VIN; a detecting circuit 201 having an input terminal coupled to the output terminal of the rectify circuit 210 to receive the rectified signal HV, and an output terminal configured to provide a square signal SP based on the rectified signal HV; and an unplug indicate circuit 202 having an input terminal coupled to the detecting circuit 201 to receive the square signal SP, and an output terminal configured to provide an unplug indicate signal BRE based on the square signal SP.

In one embodiment, the AC signal detector 200 further comprises a voltage divider. The voltage divider is coupled between the output terminal of the rectify circuit 210 and a ground, to provide a partial of the rectified signal HV with suitable level to the detecting circuit 201. Persons of ordinary skill in the art should know that the voltage divider may be eliminated while the rectified signal HV is within the input range of the detecting circuit 201. The rectified signal HV mentioned below comprises both the output signal of the rectify circuit 201 and the divided signal provided by the voltage divider.

In one embodiment, the rectify circuit 210 comprises a first diode D1 and a second diode D2, wherein the anodes of the two diodes D1 and D2 are coupled respectively to the two terminals of the AC power supply to receive the AC input signal VIN, and the cathodes of the two diodes D1 and D2 are coupled together to provide the rectified signal HV.

In one embodiment, the detecting circuit 201 comprises: a delay circuit 203 having an input terminal coupled to the output terminal of the rectify circuit 201 to receive the rectified signal HV and an output terminal configured to provide a delayed rectified signal HVD based on the rectified signal HV; and a detecting comparator 204, having a first input terminal (non-inverting input terminal) coupled to the output terminal of the rectify circuit 210 to receive the rectified signal HV, a second input terminal (inverting terminal) coupled to the output terminal of the delay circuit 203 to receive the delayed rectified signal HVD, and an output terminal configured to provide the square signal SP based on the rectified signal HV and the delayed rectified signal HVD.

In one embodiment, the unplug indicate circuit 202 comprises: a rising edge flip-flop 205 having an input terminal coupled to the output terminal of the detecting circuit 201 to receive the square signal SP and an output terminal configured to provide a rising edge pulse signal 211 at the rising edge of the square signal SP; a falling edge flip-flop 206 having an input terminal coupled to the output terminal of the detecting circuit 201 to receive the square signal SP, and an output terminal configured to provide a falling edge pulse signal 212 at the falling edge of the square signal SP; a signal adding circuit 208 having a first input terminal coupled to the output terminal of the rising edge flip-flop 205 to receive the rising edge pulse signal 211, a second input terminal coupled to the output terminal of the falling edge flip-flop 206 to receive the falling edge pulse signal 212, and an output terminal configured to provide an pulse added signal 213 based on the rising edge pulse signal 211 and the falling edge pulse signal 212; and a counting circuit 207 having an input terminal coupled to the output terminal of the signal adding circuit 208 to receive the pulse added signal 213 and an output terminal configured to provide an unplug indicate signal BRE based on the pulse added signal 213; wherein the counting circuit 207 counts interval time between the adjacent pulses of the pulse added signal 213, and the unplug indicate signal BRE is invalid when the interval time between adjacent pulses of the pulse added signal 213 is smaller than or equal to a first preset value PT1, and is valid when the interval time between adjacent pulses of the pulse added signal 213 is larger than the first preset value PT1.

In one embodiment, the unplug situation of the AC/DC converter is determined when the unplug indicate signal BRE is valid. In one embodiment, the different states of the unplug indicate signal BRE, i.e., valid or invalid are represented by the different signal levels.

Figure 3:
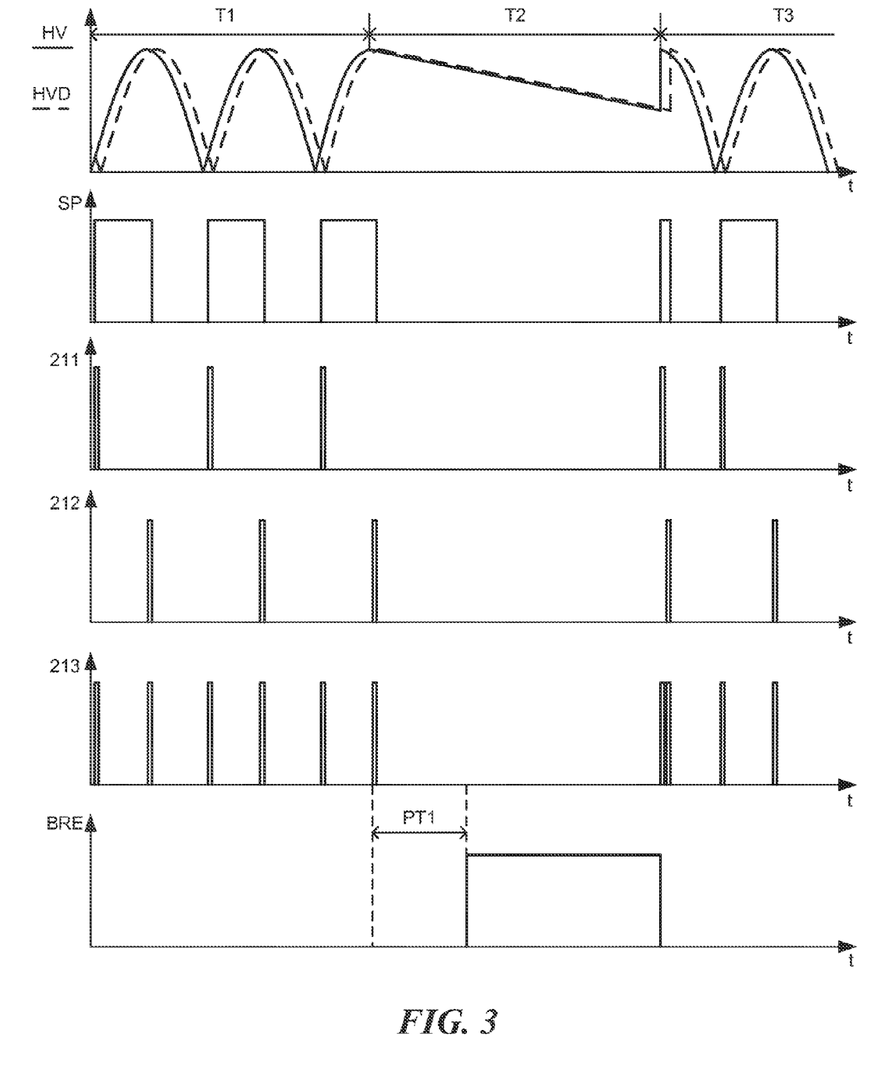
FIG. 3 shows the waveforms of the signals of the AC signal detector 200 in FIG. 2.

FIG. 3 shows the waveforms of the signals of the AC signal detector 200 in FIG. 2. The operation of the AC signal detector 200 is described with reference to FIGS. 2 and 3.

In subinterval T1, the AC/DC converter and the AC power supply are wired up properly. The waveforms of the rectified signal HV and the delayed rectified signal HVD are shown in FIG. 3. The phase difference of the rectified signal HV and the delayed rectified signal HVD is proportional to a delay time of the delay circuit 203. The detecting comparator 204 compares the rectified signal HV with the delayed rectified signal HVD to generate the square signal SP. In one embodiment, the non-inverting input terminal of the detecting comparator 204 receives the rectified signal HV, and the inverting input terminal of the detecting comparator 204 receives the delayed rectified signal HVD. As shown in FIG. 3, the square signal SP is logical high when the rectified signal HV is larger than the delayed rectified signal HVD, and is logical low when the rectified signal HV is lower than or equal to the delayed rectified signal HVD. The rising edge flip-flop 205 and the falling edge flip-flop 206 receive the square signal SP. At every rising edge of the square signal SP, the rising edge flip-flop 205 generates the rising edge pulse signal 211; while at every falling edge of the square signal SP, the falling edge flip-flop 206 generates the falling edge pulse signal 212. The signal adding circuit 208 adds the rising edge pulse signal 211 and the falling edge pulse signal 212 to generate a pulse added signal 213. In one embodiment, the signal adding circuit 208 comprises an OR gate. The counting circuit 207 receives the pulse added signal 213, and counts the interval time between adjacent pulses of the pulse added signal 213. In subinterval T1, the interval time between pulses of the pulse added signal 213 is smaller than the first preset value PT1, the counting circuit 207 generates the logical low unplug indicate signal BRE, which means the unplug indicate signal BRE is invalid and the AC power supply and the AC/DC converter are wired up properly.

In subinterval T2, the AC/DC converter is unplugged. Because of the energy stored in the X-cap CX, the rectified signal HV and the delayed rectified signal HVD decrease slowly. As can be seen from FIG. 3, the delayed rectified signal HVD is larger than the rectified signal HV during subinterval T2. Thus the square signal SP keeps logical low, and there is no pulse in the rising edge pulse signal 211, the falling edge pulse signal 212 or the pulse added signal 213. As a result, the interval time between pulses of the pulse added signal 213 is larger than the first preset value PT1. So the unplug indicate signal BRE generated by the counting circuit 207 becomes logical high indicating that the AC power supply and the AC/DC converter are wired up improperly. In FIG. 3, the AC/DC converter is unplugged during the rise of the rectified signal HV resulting in the rectified signal HV being larger than the delayed rectified signal HVD during subinterval T2. Persons of ordinary skill in the art should know that the values of the rectified signal HV and the delayed rectified signal HVD may be different depending on when the AC/DC converter is unplugged. If the AC/DC converter is unplugged during the falling of the rectified signal HV, the rectified signal HV is lower than the delayed rectified signal HVD during subinterval T2 and the square signal SP keeps logical high. Still, there is no pulse in the rising edge pulse signal 211, the falling edge pulse signal 212 or the pulse added signal 213. The unplug indicate signal BRE will be valid to indicate that the AC power supply and the AC/DC converter are wired up improperly as well.

In subinterval T3, the AC/DC converter is plugged again. The waveforms of the rectified signal HV and the delayed rectified signal HVD are shown in FIG. 3. The waveform of the square signal SP during subinterval T3 is similar to the waveform of the square signal SP during subinterval T1 because of the phase difference between the rectified signal HV and the delayed rectified signal HVD. At every rising edge of the square signal SP, the rising edge flip-flop 205 generates the rising edge pulse signal 211; and at every falling edge of the square signal SP, the falling edge flip-flop 206 generates the falling edge pulse signal 212. The signal adding circuit 208 adds the rising edge pulse signal 211 and the falling edge pulse signal 212 to generate a pulse added signal 213. The counting circuit 207 receives the pulse added signal 213, and counts the interval time between adjacent pulses of the pulse added signal 213. In one embodiment, when the interval time between adjacent pulses of the pulse added signal 213 is smaller than the first preset value PT1, the counting circuit 207 generates the logical low unplug indicate signal BRE, which means the unplug indicate signal BRE is invalid and the AC power supply and the AC/DC converter are wired up properly.

In one embodiment, the frequency of the AC power supply is 50 Hz and the switching period of the AC signal VIN is 20 mS. Persons of ordinary skill in the art should know that the frequency of the rectified signal HV and the frequency of the delayed rectified signal HVD are twice than the frequency of the AC signal VIN, and the switching periods of the rectified signal HV and the delayed rectified signal HVD both are 10 mS. As seen from FIG. 3, when the AC/DC converter is plugged properly, the switching periods of the square signal SP, the rising edge pulse signal 211 and the falling edge pulse signal 212 are all 10 mS while the switching period of the pulse added signal 213 is 5 mS. So the value of the first preset value PT1 may set to be larger than the interval time between the pulses of the pulse add signal 213, e.g. 7 mS. In real application, the first preset value PT1 could be different according to the frequency of the AC signal VIN and the demands of the system.

Figure 4:
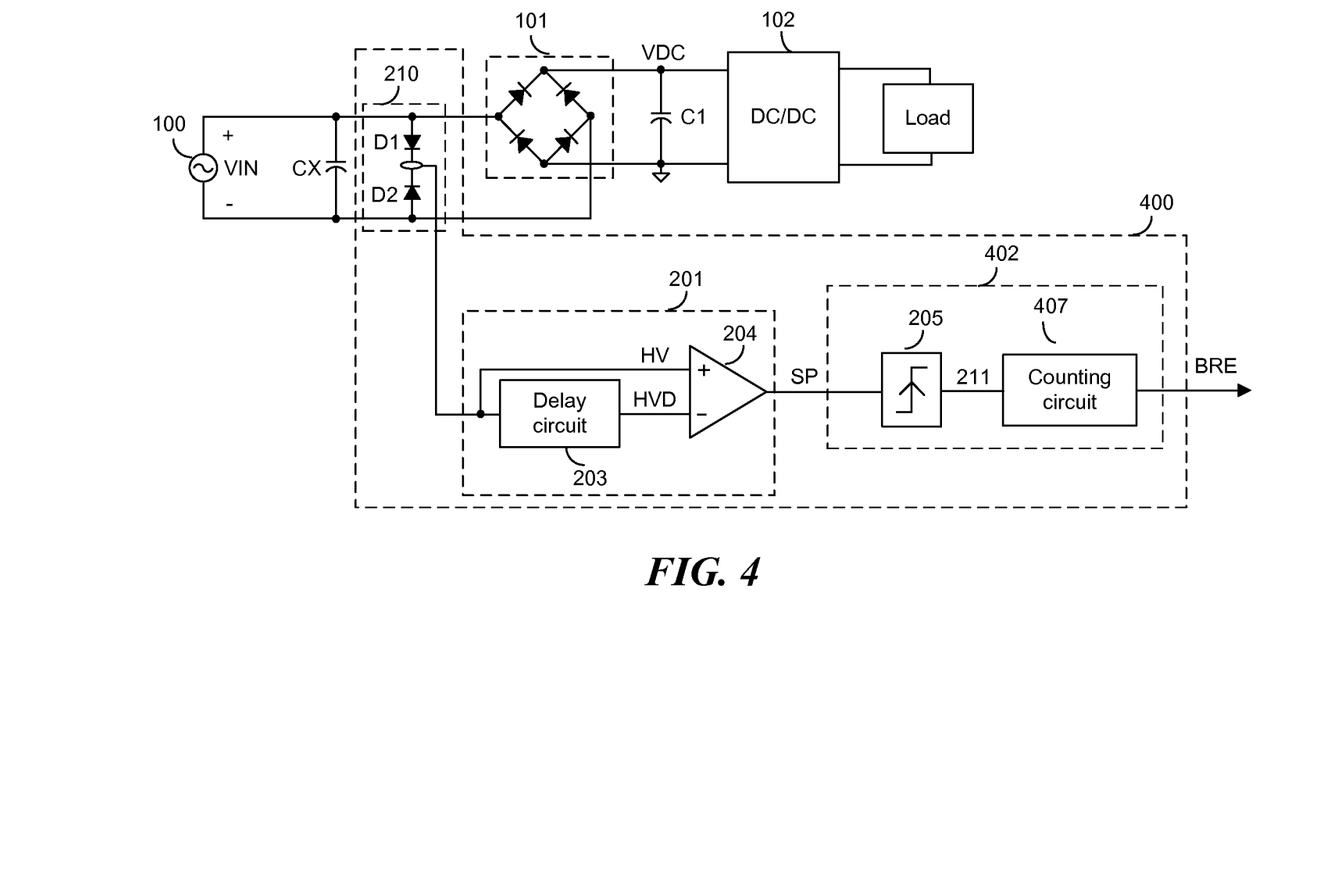
FIG. 4 schematically shows an AC signal detector 400 in accordance with an embodiment of the present invention.

FIG. 4 schematically shows an AC signal detector 400 in accordance with an embodiment of the present invention. Compared with the AC signal detector 200 in FIG. 2, the unplug indicate circuit 402 in FIG. 4 comprises: the rising edge flip-flop 205 having the input terminal coupled to the output terminal of the detecting circuit 201 to receive the square signal SP and the output terminal configured to provide the rising edge pulse signal 211 at the rising edge of the square signal SP; and the counting circuit 207 having the input terminal coupled to the output terminal of the rising edge flip-flop 205 to receive the rising edge pulse signal 211, and the output terminal configured to provide an unplug indicate signal BRE based on the rising edge pulse signal 211; wherein the counting circuit 207 counts interval time between the adjacent pulses of the rising edge pulse signal 211, and the unplug indicate signal BRE is invalid when the interval time between the adjacent pulses of the rising edge pulse signal 211 is smaller than or equal to a second preset value PT2, and is valid when the interval time between the adjacent pulses of the rising edge pulse signal 211 is larger than the second preset value PT2.

The value of the second preset value PT2 is set to be larger than the interval time between the adjacent pulses of the rising edge pulse signal 211. As described before, the interval time between the adjacent pulses of the rising edge pulse signal 211 is twice than the interval time between the adjacent pulses of the pulse added signal 213. Thus, the second preset value PT2 may be larger than the first preset value PT1. The operation of the AC signal detector 400 is similar with the operation of the AC signal detector 200, and is not described here for brevity.

Figure 5:
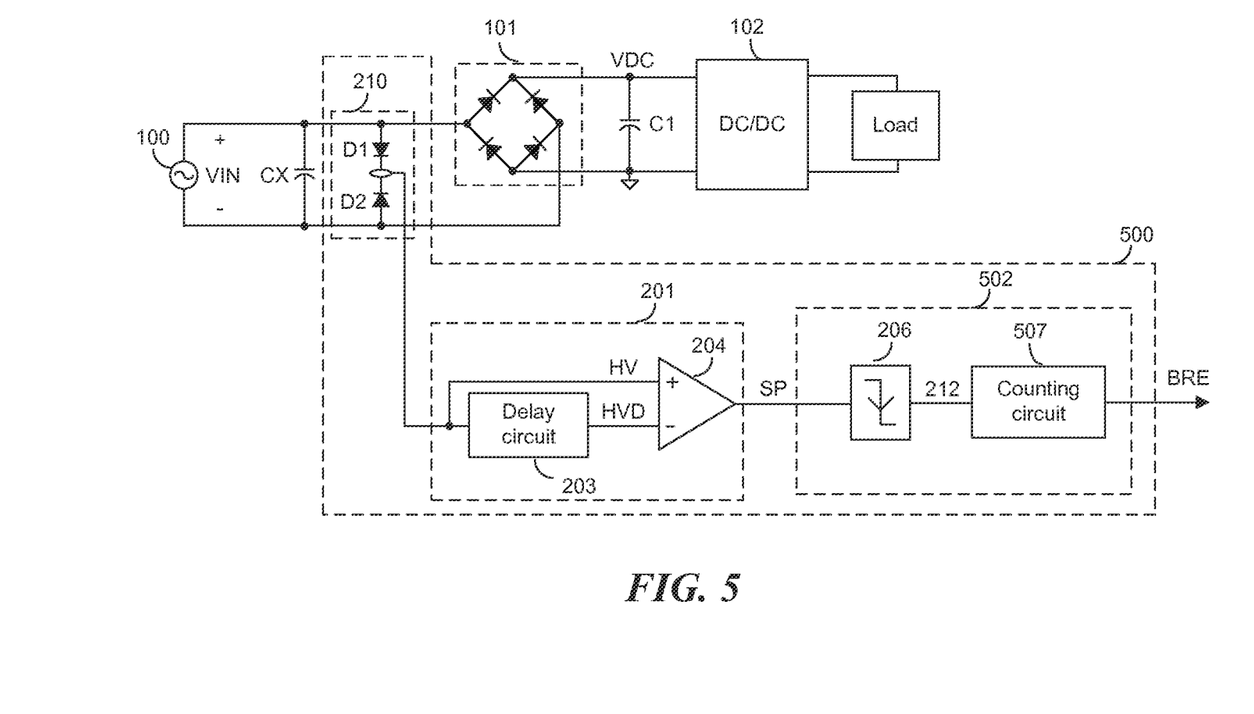
FIG. 5 schematically shows an AC signal detector 500 in accordance with an embodiment of the present invention.

FIG. 5 schematically shows an AC signal detector 500 in accordance with an embodiment of the present invention. Compared with the AC signal detector 200 in FIG. 2, the unplug indicate circuit 502 in FIG. 5 comprises: the falling edge flip-flop 206 having the input terminal coupled to the output terminal of the detecting circuit 201 to receive the square signal SP and the output terminal configured to provide the rising edge pulse signal 212 at the falling edge of the square signal SP; and the counting circuit 207 having the input terminal coupled to the output terminal of the falling edge flip-flop 206 to receive the falling edge pulse signal 212 and the output terminal configured to provide an unplug indicate signal BRE based on the falling edge pulse signal 212; wherein the counting circuit 207 counts the interval time between the adjacent pulses of the falling edge pulse signal 211, and the unplug indicate signal BRE is invalid when the interval time between the adjacent pulses of the falling edge pulse signal 212 is smaller than or equal to a third preset value PT3, and is valid when the interval time between the adjacent pulses of the falling edge pulse signal 212 is larger than the third preset value PT3.

The value of the third preset value PT3 is set to be larger than the interval time between the adjacent pulses of the falling edge pulse signal 212. As described before, the interval time between the adjacent pulses of the falling edge pulse signal 212 is the same with the interval time between the adjacent pulses of the rising edge pulse signal 211. As a result, the third preset value PT3 may be the same with the second preset value PT2. The operation of the AC signal detector 500 is similar with the operation of the AC signal detector 200, and is not described here for brevity.

Figure 6:
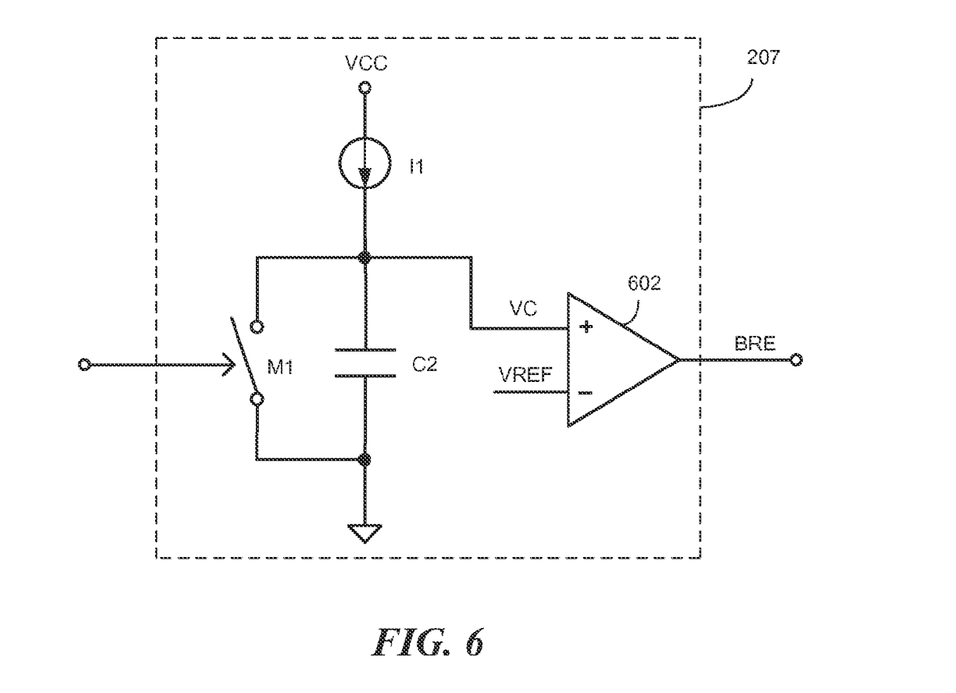
FIG. 6 schematically shows the counting circuit 207 in accordance with an embodiment of the present invention.

FIG. 6 schematically shows the counting circuit 207 in accordance with an embodiment of the present invention. The counting circuit 207 comprises: a charging current source I1 having a first terminal coupled to an internal power VCC and a second terminal configured to provide a current; a capacitor C2 having a first terminal coupled to the second terminal of the charging current source I1 to receive the current and a second terminal connected to the ground; a counting switch M1 having a first terminal coupled to the first terminal of the capacitor C2, a second terminal connected to the ground and a control terminal coupled to the input terminal of the counting circuit 207, wherein based on the signal at the input terminal of the counting circuit 207, the counting switch M1 is turned ON and OFF; and a counting comparator 602 having a first input terminal coupled to the first terminal of the capacitor C2, a second input terminal configured to receive a reference signal VREF, and an output terminal configured to provide the unplug indicate signal BRE based on a voltage across the capacitor C2 and the reference signal VREF.

In one embodiment, the AC signal detector and the DC/DC converter 102 are integrated in one chip, and the internal power VCC is provided by the DC/DC converter 102. In one embodiment, the AC signal detector and the DC/DC converter 102 are separated in different chips. Then the internal power VCC may be provided by a power supply or may be provided by the DC/DC converter 102.

Figure 7:
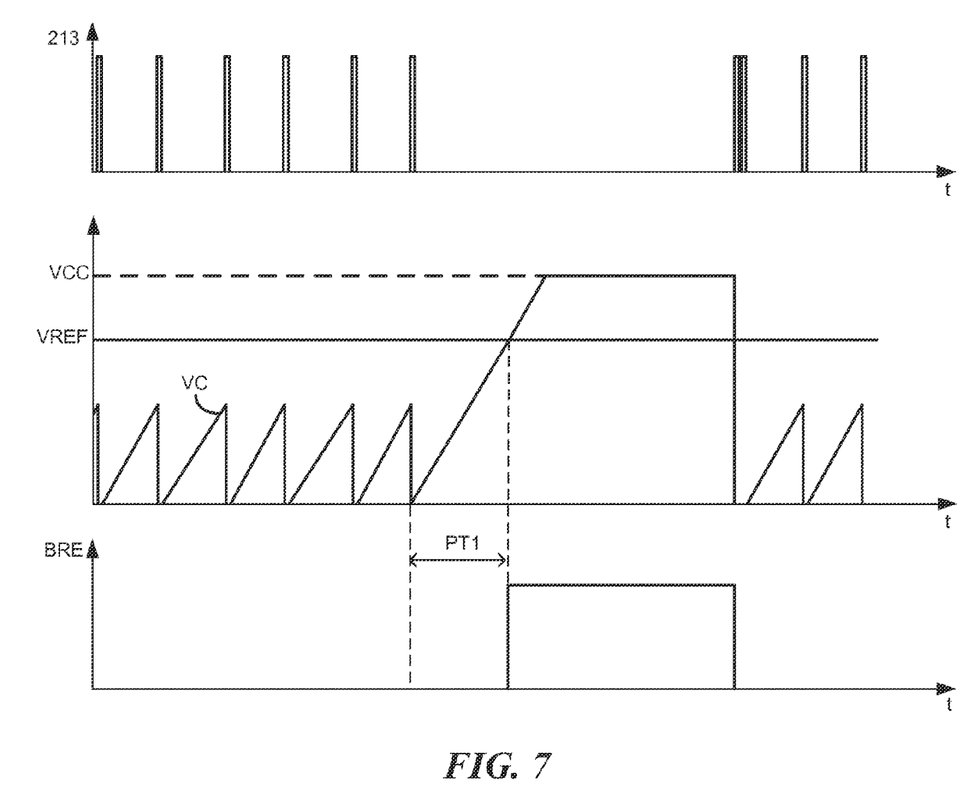
FIG. 7 shows the waveforms of the signals of the counting circuit 207 shown in FIG. 6.

FIG. 7 shows the waveforms of the signals of the counting circuit 207 shown in FIG. 6. The operation of the counting circuit 207 is described with reference to the AC signal detector 200 and the waveforms in FIG. 7. Persons of ordinary skill in the art should know that the counting circuit 207 in FIG. 6 may be applied in any of the AC signal detectors in FIGS. 2, 4 and 5. The control terminal of the counting switch M1 is coupled to output terminal of the signal adding circuit 208 to receive the pulse added signal 213 when the counting circuit 207 applied in the AC signal detector 200. In one embodiment, the counting switch M1 is turned ON during the pulse time of the pulse added signal 213, and is turned OFF during interval time between the pulses of the pulse added signal 213. Meanwhile, the capacitor C2 is charged from zero every time when the counting switch M1 is turned OFF, and is discharged every time when the counting switch M1 is turned ON, as shown in FIG. 7.

In one embodiment, the non-inverting input terminal of the counting comparator 602 is coupled to the first terminal of the capacitor C2 to receive the voltage VC across the capacitor C2, and the inverting input terminal of the counting comparator 602 is configured to receive the reference signal VREF. If the AC power supply and the AC/DC converter are wired up properly, then the frequency of the pulse added signal 213 is constant, and the capacitor C2 is discharged before the voltage VC reaches the reference signal VREF. So the unplug indicate signal BRE keeps logical low (invalid) to indicate that the AC power supply and the AC/DC converter are wired up properly. If the AC power supply and the AC/DC converter are wired up improperly, then there is no pulse in the pulse added signal 213, and the counting switch M1 keeps OFF. As a result, the voltage VC across the capacitor C2 could be charged to the reference signal VREF to flip the counting comparator 602. So the unplug indicate signal BRE becomes logical high (valid) to indicate that the AC/DC converter is unplugged. The upper limit of the voltage VC across the capacitor C2 is set to be the internal power VCC, and could be other values in other embodiments.

If the counting circuit 207 shown in FIG. 6 is applied to the AC signal detector 400 shown in FIG. 4, then the control terminal of the counting switch M1 is coupled to the output terminal of the rising edge flip-flop 205 to receive the rising edge pulse signal 211. If the counting circuit 207 shown in FIG. 6 is applied to the AC signal detector 500 shown in FIG. 5, then the control terminal of the counting switch M1 is coupled to the output terminal of the falling edge flip-flop 206 to receive the falling edge pulse signal 212.

Any suitable circuits for realizing the counting function described above may be used without detracting from the merits of the present invention. The counting circuit 207 may be automatically generated by hardware description language, for example, VHDL (Very-High-Speed Integrated Circuit Hardware Description Language) or Verilog HDL, by person of ordinary skill in the art.

Figure 8A:
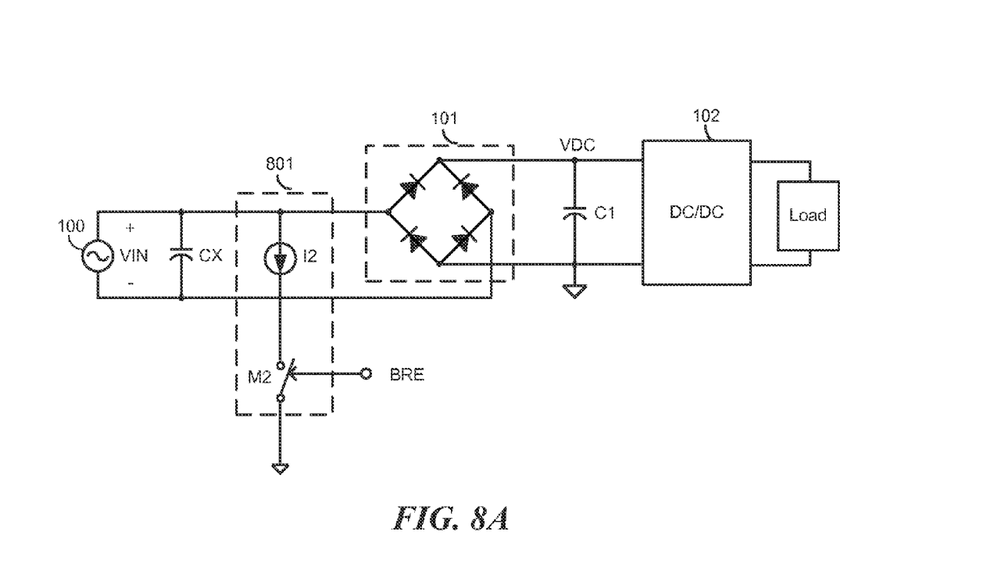
FIG. 8A schematically shows a discharging circuit for X-cap in accordance with an embodiment of the present invention.

FIG. 8A schematically shows a discharging circuit for X-cap in accordance with an embodiment of the present invention. In FIG. 8A, the discharging circuit 801 for X cap having a first terminal coupled to the first terminal of the X-cap, a second terminal connected to the ground and a control terminal coupled to the output terminal of the AC signal detector described above to receive the unplug indicate signal BRE; wherein the discharging circuit 801 discharges the X-cap when the unplug indicate signal BRE is valid.

Persons of ordinary skill in the art should know that any of the AC signal detectors 200, 400 and 500 described before may be applied to provide the unplug indicate signal BRE to the discharging circuit 801.

In one embodiment, the discharging circuit 801 comprises a discharging current source I2 and a discharging switch M2 coupled in series, wherein the discharging switch M2 is controlled by the unplug indicate signal BRE. The discharging switch M2 is turned ON when the unplug indicate signal BRE is valid, and then the X-cap CX is discharged by the discharging current source I2; the discharging switch M2 is turned OFF when the unplug indicate signal is invalid, and then the X-cap CX could not be discharged.

In the example of FIG. 8a, the discharging current source I2 is coupled between the X-cap CX and the discharging switch M2. The discharging switch M2 has a control terminal configured to receive the unplug indicate signal BRE. The discharging current source I2 discharges the X-cap CX when the discharging switch M2 is turned ON by the valid unplug indicate signal BRE.

Figure 8B:
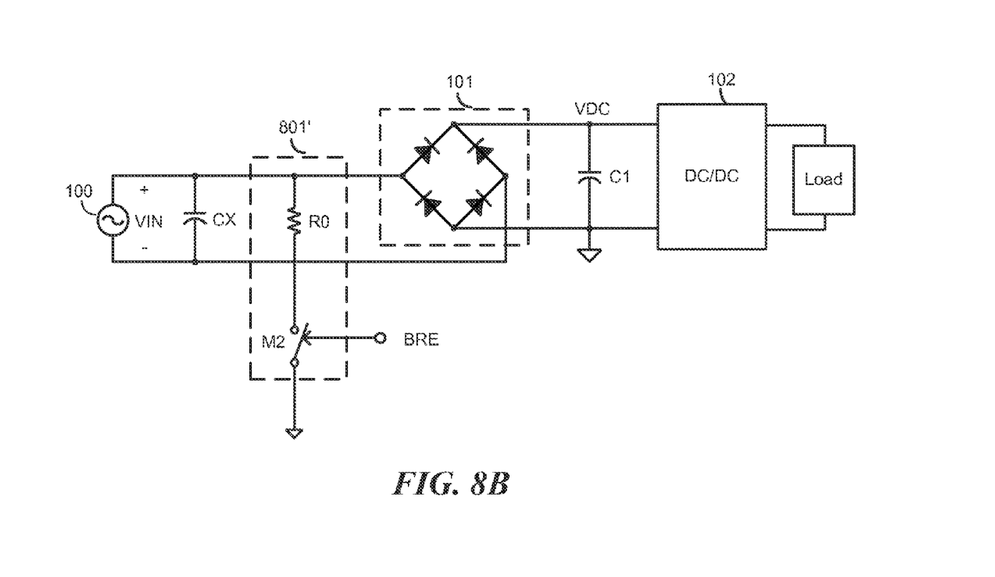
FIG. 8B schematically shows a discharging circuit for X-cap in accordance with an embodiment of the present invention.

Persons of ordinary skill in the art should know that the discharging current source I2 may be realized by many circuits and devices. FIG. 8B schematically shows a discharging circuit 801' for X-cap in accordance with an embodiment of the present invention. Compared with the circuit in FIG. 8a, the discharging circuit 801' comprises a resistor R0 and the discharging switch M2 coupled in series. In other words, the discharging current source I2 is realized by the resistor R0. The value of the resistor R0 varies depending on the real application.

Persons of ordinary skill in the art should know that the positions of the discharging current source I2 and the discharging switch M2 may be swapped. Any circuits may discharge the X-cap CX when the unplug indicate signal BRE is valid could be used without detracting from the merits of the present invention.

Figure 9:
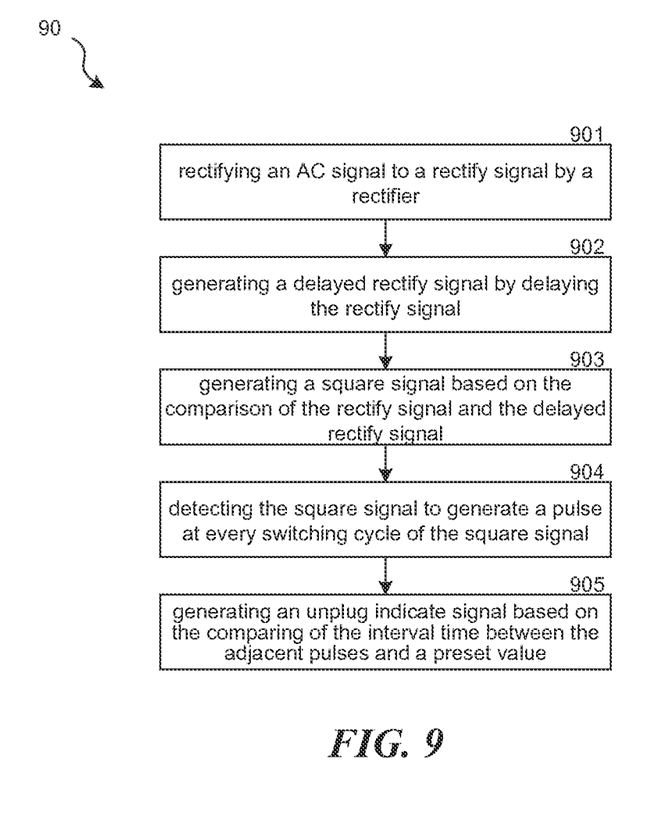
FIG. 9 shows a flowchart of a method 900 for detecting the AC signal in accordance with an embodiment of the present invention.

FIG. 9 shows a flowchart of a method 900 for detecting the AC signal in accordance with an embodiment of the present invention. The method 900 comprises: step 901, rectifying an AC signal to a rectified signal by a rectifier; step 902, generating a delayed rectified signal by delaying the rectified signal; step 903, generating a square signal based on the comparison of the rectified signal and the delayed rectified signal; step 904, detecting the square signal to generate a pulse at every switching cycle of the square signal; and step 905, generating an unplug indicate signal based on comparing the interval time between the adjacent pulses with a preset value; wherein the unplug indicate signal is valid to indicate that the AC signal is unplugged when the interval time between the adjacent pulses is larger than the preset value, and the unplug indicate signal is invalid to indicate that the AC signal is plugged properly when the interval time between the adjacent pulses is smaller than the preset value.

In one embodiment, the step 904 comprises: generating the pulse at the rising edge of the square signal.

In one embodiment, the step 904 comprises: generating the pulse at the falling edge of the square signal.

In one embodiment, the step 904 comprises: generating the pulse at both the rising edge and the falling edge of the square signal.

In one embodiment, the method 90 may be applied to control the discharging of the X-cap of an AC/DC converter. When the unplug indicate signal generated by the method 90 is valid, the X-cap is discharged.

An effective technique for AC signal detecting has been disclosed. While specific embodiments of the present invention have been provided, it is to be understood that these embodiments are for illustration purposes and not limiting. Many additional embodiments will be apparent to persons of ordinary skill in the art reading this invention.

We claim:

1. An AC signal detector, comprising:
   a rectify circuit having a first input terminal and a second input terminal configured to receive an AC signal, and an output terminal configured to provide a rectified signal based on the AC signal;
   a detecting circuit having an input terminal coupled to the output terminal of the rectify circuit to receive the rectified signal, and an output terminal configured to provide a square signal based on the rectified signal; and
   an unplug indicate circuit having an input terminal coupled to the detecting circuit to receive the square signal, and an output terminal configured to provide an unplug indicate signal based on the square signal.

2. The AC signal detector of claim 1, wherein the detecting circuit comprises:
   a delay circuit having an input terminal coupled to the output terminal of the rectify circuit to receive the rectified signal and an output terminal configured to provide a delayed rectified signal based on the rectified signal; and
   a detecting comparator, having a first input terminal coupled to the output terminal of the rectify circuit to receive the rectified signal, a second input terminal coupled to the output terminal of the delay circuit to receive the delayed rectified signal, and an output terminal configured to provide the square signal based on the rectified signal and the delayed rectified signal.

3. The AC signal detector of claim 1, wherein the unplug indicate circuit comprises:
   a rising edge flip-flop having an input terminal coupled to the output terminal of the detecting circuit to receive the square signal and an output terminal configured to provide a rising edge pulse signal based on the square signal;
   a falling edge flip-flop having an input terminal coupled to the output terminal of the detecting circuit to receive the square signal, and an output terminal configured to provide a falling edge pulse signal at the falling edge of the square signal;
   an signal adding circuit having a first input terminal coupled to the output terminal of the rising edge flip-flop to receive the rising edge pulse signal, a second input terminal coupled to the output terminal of the falling edge flip-flop to receive the falling edge pulse signal, and an output terminal configured to provide an pulse added signal based on the rising edge pulse signal and the falling edge pulse signal; and
   a counting circuit having an input terminal coupled to the output terminal of the signal adding circuit to receive the pulse added signal and an output terminal configured to provide an unplug indicate signal based on the pulse added signal;
   wherein the counting circuit counts interval time between adjacent pulses of the pulse added signal, and the unplug indicate signal is invalid when the interval time between adjacent pulses of the pulse added signal is smaller than or equal to a first preset value, and is valid when the interval time between the adjacent pulses of the pulse added signal is larger than the first preset value.

4. The AC signal detector of claim 3, wherein the counting circuit comprises:
   a charging current source having a first terminal coupled to an internal power and a second terminal configured to provide a current;
   a capacitor having a first terminal coupled to the second terminal of the charging current source to receive the current and a second terminal connected to a ground;
   a counting switch having a first terminal coupled to the first terminal of the capacitor, a second terminal connected to the ground and a control terminal configured to receive the pulse added signal, wherein based on the pulse added signal, the counting switch is turned ON and OFF; and
   a counting comparator having a first input terminal coupled to the first terminal of the capacitor, a second input terminal configured to receive a reference signal, and an output terminal configured to provide the unplug indicate signal based on a voltage across the capacitor and the reference signal.

5. The AC signal detector of claim 1, wherein the unplug indicate circuit comprises:
   a rising edge flip-flop having an input terminal coupled to the output terminal of the detecting circuit to receive the square signal and an output terminal configured to provide a rising edge pulse signal at a rising edge of the square signal; and
   a counting circuit having an input terminal coupled to the output terminal of the rising edge flip-flop to receive the rising edge pulse signal, and an output terminal configured to provide an unplug indicate signal based on the rising edge pulse signal;
   wherein the counting circuit counts an interval time between adjacent pulses of the rising edge pulse signal, and the unplug indicate signal is invalid when the interval time between the adjacent pulses of the rising edge pulse signal is smaller than or equal to a second preset value, and is valid when the interval time between the adjacent pulses of the rising edge pulse signal is larger than the second preset value.

6. The AC signal detector of claim 5, wherein the counting circuit comprises:
   a charging current source having a first terminal coupled to an internal power and a second terminal configured to provide a current;
   a capacitor having a first terminal coupled to the second terminal of the charging current source to receive the current and a second terminal connected to a ground;
   a counting switch having a first terminal coupled to the first terminal of the capacitor, a second terminal connected to the ground and a control terminal configured to receive the rising edge pulse signal, wherein based on the rising edge pulse signal, the counting switch is turned ON and OFF; and
   a counting comparator having a first input terminal coupled to the first terminal of the capacitor, a second input terminal configured to receive a reference signal, and an output terminal configured to provide the unplug indicate signal based on a voltage across the capacitor and the reference signal.

7. The AC signal detector of claim 1, wherein the unplug indicate circuit comprises:
   a falling edge flip-flop having an input terminal coupled to the output terminal of the detecting circuit to receive the square signal and an output terminal configured to provide a falling edge pulse signal at a rising edge of the square signal; and
   a counting circuit having an input terminal coupled to the output terminal of the falling edge flip-flop to receive the falling edge pulse signal, and an output terminal configured to provide an unplug indicate signal based on the falling edge pulse signal;

wherein the counting circuit counts interval time between adjacent pulses of the falling edge pulse signal, and the unplug indicate signal is invalid when the interval time between the adjacent pulses of the falling edge pulse signal is smaller than or equal to a second preset value, and is valid when the interval time between the adjacent pulses of the falling edge pulse signal is larger than the second preset value.

8. The AC signal detector of claim 7, wherein the counting circuit comprises:
a charging current source having a first terminal coupled to an internal power and a second terminal configured to provide a current;
a capacitor having a first terminal coupled to the second terminal of the charging current source to receive the current and a second terminal connected to a ground;
a counting switch having a first terminal coupled to the first terminal of the capacitor, a second terminal connected to the ground and a control terminal configured to the receive the falling edge pulse signal, wherein based on the falling edge pulse signal, the counting switch is turned ON and OFF; and
a counting comparator having a first input terminal coupled to the first terminal of the capacitor, a second input terminal configured to receive a reference signal, and an output terminal configured to provide the unplug indicate signal based on a voltage across the capacitor and the reference signal.

9. An AC/DC converter, comprising:
a X-cap having a first terminal and a second terminal, wherein the X-cap is coupled in parallel with an AC signal;
a rectify circuit having a first input terminal and a second input terminal configured to receive the AC signal, and an output terminal configured to provide a rectified signal based on the AC signal;
a detecting circuit having an input terminal coupled to the output terminal of the rectify circuit to receive the rectified signal, and an output terminal configured to provide a square signal based on the rectified signal;
an unplug indicate circuit having an input terminal coupled to the detecting circuit to receive the square signal, and an output terminal configured to provide an unplug indicate signal based on the square signal; and
a discharging circuit having a first terminal coupled to the first terminal of the X cap, a second terminal connected to a ground and a control terminal configured to receive the unplug indicate signal;
wherein the discharging circuit discharges the X-cap when the unplug indicate signal is valid.

10. The AC/DC converter of claim 9, wherein the detecting circuit comprises:
a delay circuit having an input terminal coupled to the output terminal of the rectify circuit to receive the rectified signal and an output terminal configured to provide a delayed rectified signal based on the rectified signal; and
a detecting comparator, having a first input terminal coupled to the output terminal of the rectify circuit to receive the rectified signal, a second input terminal coupled to the output terminal of the delay circuit to receive the delayed rectified signal, and an output terminal configured to provide the square signal based on the rectified signal and the delayed rectified signal.

11. The AC/DC converter of claim 9, wherein the unplug indicate circuit comprises:
a rising edge flip-flop having an input terminal coupled to the output terminal of the detecting circuit to receive the square signal and an output terminal configured to provide a rising edge pulse signal based on the square signal;
a falling edge flip-flop having an input terminal coupled to the output terminal of the detecting circuit to receive the square signal, and an output terminal configured to provide a falling edge pulse signal at the falling edge of the square signal;
an signal adding circuit having a first input terminal coupled to the output terminal of the rising edge flip-flop to receive the rising edge pulse signal, a second input terminal coupled to the output terminal of the falling edge flip-flop to receive the falling edge pulse signal, and an output terminal configured to provide an pulse added signal based on the rising edge pulse signal and the falling edge pulse signal; and
a counting circuit having an input terminal coupled to the output terminal of the signal adding circuit to receive the pulse added signal and an output terminal configured to provide an unplug indicate signal based on the pulse added signal;
wherein the counting circuit counts the pulse added signal, and the unplug indicate signal is invalid when the interval time between adjacent pulses of the pulse added signal is smaller than or equal to a first preset value, and is valid when the interval time between the adjacent pulses of the pulse added signal is larger than the first preset value.

12. The AC/DC converter of claim 11, wherein the counting circuit comprises:
a charging current source having a first terminal coupled to an internal power and a second terminal configured to provide a current;
a capacitor having a first terminal coupled to the second terminal of the charging current source to receive the current and a second terminal connected to a ground;
a counting switch having a first terminal coupled to the first terminal of the capacitor, a second terminal connected to the ground and a control terminal configured to receive the pulse added signal, wherein based on the pulse added signal, the counting switch is turned ON and OFF; and
a counting comparator having a first input terminal coupled to the first terminal of the capacitor, a second input terminal configured to receive a reference signal, and an output terminal configured to provide the unplug indicate signal based on a voltage across the capacitor and the reference signal.

13. The AC/DC converter of claim 9, wherein the unplug indicate circuit comprises:
a rising edge flip-flop having an input terminal coupled to the output terminal of the detecting circuit to receive the square signal and an output terminal configured to provide a rising edge pulse signal at a rising edge of the square signal; and
a counting circuit having an input terminal coupled to the output terminal of the rising edge flip-flop to receive the rising edge pulse signal, and an output terminal configured to provide an unplug indicate signal based on the rising edge pulse signal;
wherein the counting circuit counts interval time between adjacent pulses of the rising edge pulse signal, and the unplug indicate signal is invalid when the interval time between the adjacent pulses of the rising edge pulse signal is smaller than or equal to a second preset value, and is valid when the interval time between the adjacent pulses of the rising edge pulse signal is larger than the second preset value.

14. The AC/DC converter of claim 13, wherein the counting circuit comprises:
    a charging current source having a first terminal coupled to an internal power and a second terminal configured to provide a current;
    a capacitor having a first terminal coupled to the second terminal of the charging current source to receive the current and a second terminal connected to a ground;
    a counting switch having a first terminal coupled to the first terminal of the capacitor, a second terminal connected to the ground and a control terminal configured to the receive the rising edge pulse signal, wherein based on the rising edge pulse signal, the counting switch is turned ON and OFF; and
    a counting comparator having a first input terminal coupled to the first terminal of the capacitor, a second input terminal configured to receive a reference signal, and an output terminal configured to provide the unplug indicate signal based on a voltage across the capacitor and the reference signal.

15. The AC/DC converter of claim 9, wherein the unplug indicate circuit comprises:
    a falling edge flip-flop having an input terminal coupled to the output terminal of the detecting circuit to receive the square signal and an output terminal configured to provide a falling edge pulse signal at a rising edge of the square signal; and
    a counting circuit having an input terminal coupled to the output terminal of the falling edge flip-flop to receive the falling edge pulse signal, and an output terminal configured to provide an unplug indicate signal based on the falling edge pulse signal;
    wherein the counting circuit counts interval time between adjacent pulses of the falling edge pulse signal, and the unplug indicate signal is invalid when the interval time between the adjacent pulses of the falling edge pulse signal is smaller than or equal to a second preset value, and is valid when the interval time between the adjacent pulses of the falling edge pulse signal is larger than the second preset value.

16. The AC/DC converter of claim 15, wherein the counting circuit comprises:
    a charging current source having a first terminal coupled to an internal power and a second terminal configured to provide a current;
    a capacitor having a first terminal coupled to the second terminal of the charging current source to receive a current and a second terminal connected to a ground;
    a counting switch having a first terminal coupled to the first terminal of the capacitor, a second terminal connected to the ground and a control terminal configured to the receive the falling edge pulse signal, wherein based on the falling edge pulse signal, the counting switch is turned ON and OFF; and
    a counting comparator having a first input terminal coupled to the first terminal of the capacitor, a second input terminal configured to receive a reference signal, and an output terminal configured to provide the unplug indicate signal based on a voltage across the capacitor and the reference signal.

17. A method for detecting an AC signal, comprising:
    rectifying the AC signal to a rectified signal by a rectifier;
    generating a delayed rectified signal by delaying the rectified signal;
    generating a square signal based on a comparison of the rectified signal and a delayed rectified signal;
    detecting the square signal to generate a pulse at every switching cycle of the square signal; and
    generating an unplug indicate signal based on comparing an interval time between adjacent pulses with a preset value;
    wherein the unplug indicate signal is valid to indicate that the AC signal is unplugged when the interval time between the adjacent pulses is larger than the preset value, and the unplug indicate signal is invalid to indicate that the AC signal is plugged properly when the interval time between the adjacent pulses is smaller than the preset value.

18. The method of claim 17, wherein detecting the square signal to generate a pulse at every switching cycle of the square signal comprises generating the pulse at a rising edge of the square signal.

19. The method of claim 17, wherein detecting the square signal to generate a pulse at every switching cycle of the square signal comprises generating the pulse at a falling edge of the square signal.

20. The method of claim 17, wherein detecting the square signal to generate a pulse at every switching cycle of the square signal comprises generating the pulse at both a rising edge and the falling edge of the square signal.

* * * * *